United States Patent
Kim

(10) Patent No.: US 11,830,537 B2
(45) Date of Patent: Nov. 28, 2023

(54) MEMORY AND OPERATION METHOD OF THE MEMORY

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/887,554

(22) Filed: Aug. 15, 2022

(65) Prior Publication Data

US 2022/0383942 A1 Dec. 1, 2022

Related U.S. Application Data

(62) Division of application No. 17/365,416, filed on Jul. 1, 2021, now Pat. No. 11,501,819.

(30) Foreign Application Priority Data

Feb. 18, 2021 (KR) .................. 10-2021-0021915

(51) Int. Cl.
| | | |
|---|---|---|
| G11C 7/00 | (2006.01) | |
| G11C 11/406 | (2006.01) | |
| G11C 29/00 | (2006.01) | |
| G11C 7/10 | (2006.01) | |

(52) U.S. Cl.
CPC ........ *G11C 11/40622* (2013.01); *G11C 7/106* (2013.01); *G11C 7/1087* (2013.01); *G11C 11/40615* (2013.01); *G11C 29/783* (2013.01)

(58) Field of Classification Search
CPC .................................................. G11C 11/40622
USPC ........................................................ 365/222
See application file for complete search history.

(56) References Cited

U.S. PATENT DOCUMENTS

2018/0182445 A1* 6/2018 Lee .................. G11C 11/408
2021/0375346 A1* 12/2021 Lim .................. G11C 11/406

* cited by examiner

*Primary Examiner* — Hoai V Ho
(74) *Attorney, Agent, or Firm* — IP & T GROUP LLP

(57) ABSTRACT

A memory core including a memory core including memory cells that are arranged in a plurality of rows and a plurality of columns; and a refresh target selection circuit suitable for storing an address and a risk score of each of activated rows among the rows, wherein the refresh target selection circuit is further suitable for increasing the risk score of a corresponding row whenever the corresponding row is activated, whenever a row at a '+2' position of the corresponding row is activated, and whenever a row at a '−2' position of the corresponding row is activated.

6 Claims, 4 Drawing Sheets

MEMORY AND OPERATION METHOD OF THE MEMORY

CROSS-REFERENCE TO RELATED APPLICATIONS

The present application is a division of U.S. patent application Ser. No. 17/365,416 filed on Jul. 1, 2021, which claims priority of Korean Patent Application No. 10-2021-0021915, filed on Feb. 18, 2021, which is incorporated herein by reference in its entirety.

BACKGROUND

1. Field

Various embodiments of the present invention relate to a memory.

2. Description of the Related Art

As the degree of integration of memories increases, the spacing between a plurality of word lines included in a memory are decreasing. As the spacing between word lines decreases, the coupling effect between the neighboring word lines increases.

Whenever a data is input or output to or from a memory cell, a word line toggles between an active state and an inactive state. As the coupling effect between the neighboring word lines increases, which is described above, data in a memory cell which is coupled to a word line that is disposed adjacent to the frequently activated word line may be damaged. This phenomenon is referred to as row hammering. Since the data of the memory cell is damaged before the memory cell is refreshed due to the word line disturbance, there is a concern.

FIG. 1 is a block diagram illustrating row hammering. FIG. 1 shows a portion of a cell array included in a memory device.

In FIG. 1, 'WLL' indicates a frequently activated word line, and 'WLL−1' and 'WLL+1' indicate respective word lines disposed adjacent to 'WLL', that is, word lines disposed adjacent to the frequently activated word line. Also, 'CL' indicates a memory cell coupled to 'WLL', and 'CL−1' indicates a memory cell coupled to 'WLL−1', and 'CL+1' indicates a memory cell coupled to 'WLL+1'. Each memory cell may include a cell transistor TL, TL−1, or TL+1 and a cell capacitor CAPL, CAPL−1, or CAPL+1.

In FIG. 1, when 'WLL' is activated or deactivated, the voltages of 'WLL−1' and 'WLL+1' may increase or decrease due to the coupling effect that occurs between 'WLL' and 'WLL−1' and 'WLL+1', affecting the amounts of charges in the cell capacitors CL−1 and CL+1. Therefore, when 'WLL' is frequently activated and 'WLL' toggles between an activated state and a deactivated state, variation in the amounts of charges stored in the cell capacitors CAPL−1 and CAPL+1 included in the 'CL−1' and 'CL+1' becomes large, and the data in the memory cell may be deteriorated.

That is, the electromagnetic wave generated when a word line toggles between the activated state and the deactivated state may damage the data stored in a cell capacitor of a memory cell coupled to a neighboring word line by charging/discharging electrons into/from the cell capacitor of the memory cell coupled to the neighboring word line.

As for a method for solving the concern of the row hammering, a method of detecting a row of memory cells that has been activated several times and refreshing the neighboring rows of the row that has been activated several times is mainly used.

SUMMARY

Embodiments of the present invention are directed to a technology capable of efficiently selecting rows to be refreshed according to those rows that have experienced more row hammering.

In accordance with one embodiment of the present invention, a memory includes: a memory core including memory cells that are arranged in a plurality of rows and a plurality of columns; and a refresh target selection circuit suitable for storing an address and a risk score of each of activated rows among the rows, wherein the refresh target selection circuit is further suitable for increasing the risk score of a corresponding row whenever the corresponding row is activated, whenever a row at a '+2' position of the corresponding row is activated, and whenever a row at a '−2' position of the corresponding row is activated.

In accordance with another embodiment of the present invention, a memory includes: a memory core including memory cells that are arranged in a plurality of rows and a plurality of columns; N address latches respectively suitable for storing addresses of N activated rows, N being an integer equal to or greater than 2; N counters respectively corresponding to the N address latches and respectively counting the risk scores of the N activated rows; and a random sampling circuit suitable for randomly sampling an address of an activated row in the memory core.

In accordance with yet another embodiment of the present invention, a method for operating a memory includes: activating a $K^{th}$ row in a memory core, K being an integer equal to or greater than 2; storing an address of the $K^{th}$ row in a refresh target row storage circuit and updating a risk score of the $K^{th}$ row in response to the activation of the $K^{th}$ row; activating a $(K+2)^{th}$ row of the memory core; storing an address of the $(K+2)^{th}$ row in the refresh target row storage circuit and updating a risk score of the $(K+2)^{th}$ row in response to the activation of the $(K+2)^{th}$ row; and increasing the risk score of the $K^{th}$ row in response to the activation of the $(K+2)^{th}$ row.

In accordance with still yet another embodiment of the present invention, a method for operating a memory includes: increasing a count for a selected row whenever any of the selected row and predetermined rows is activated; and refreshing, during a smart refresh operation, neighboring rows of the selected row according to the count, wherein the predetermined rows are a predetermined number of rows adjacent to the selected row.

In accordance with still yet another embodiment of present invention, an operation method of a memory includes: randomly sampling an address of an activated row in a memory core; receiving a smart refresh command; performing a smart refresh operation for rows disposed adjacent to a row corresponding to an address with the highest risk score among addresses stored in address latches, in response to the smart refresh command; and replacing the address with the highest risk score in the address latches with the randomly sampled address.

DETAILED DESCRIPTION

Figure 1:
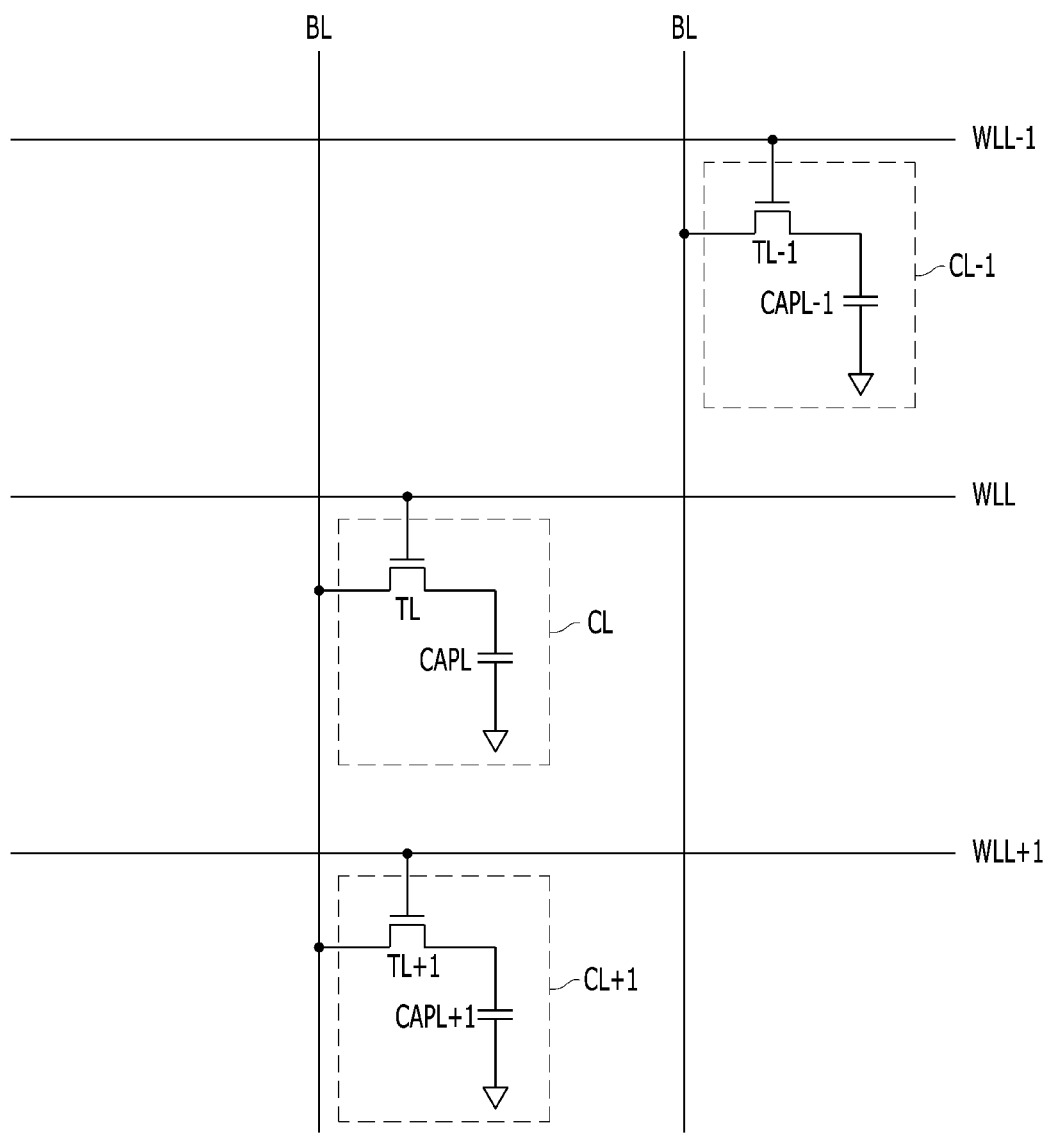
FIG. 1 is a block diagram illustrating row hammering.

Embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
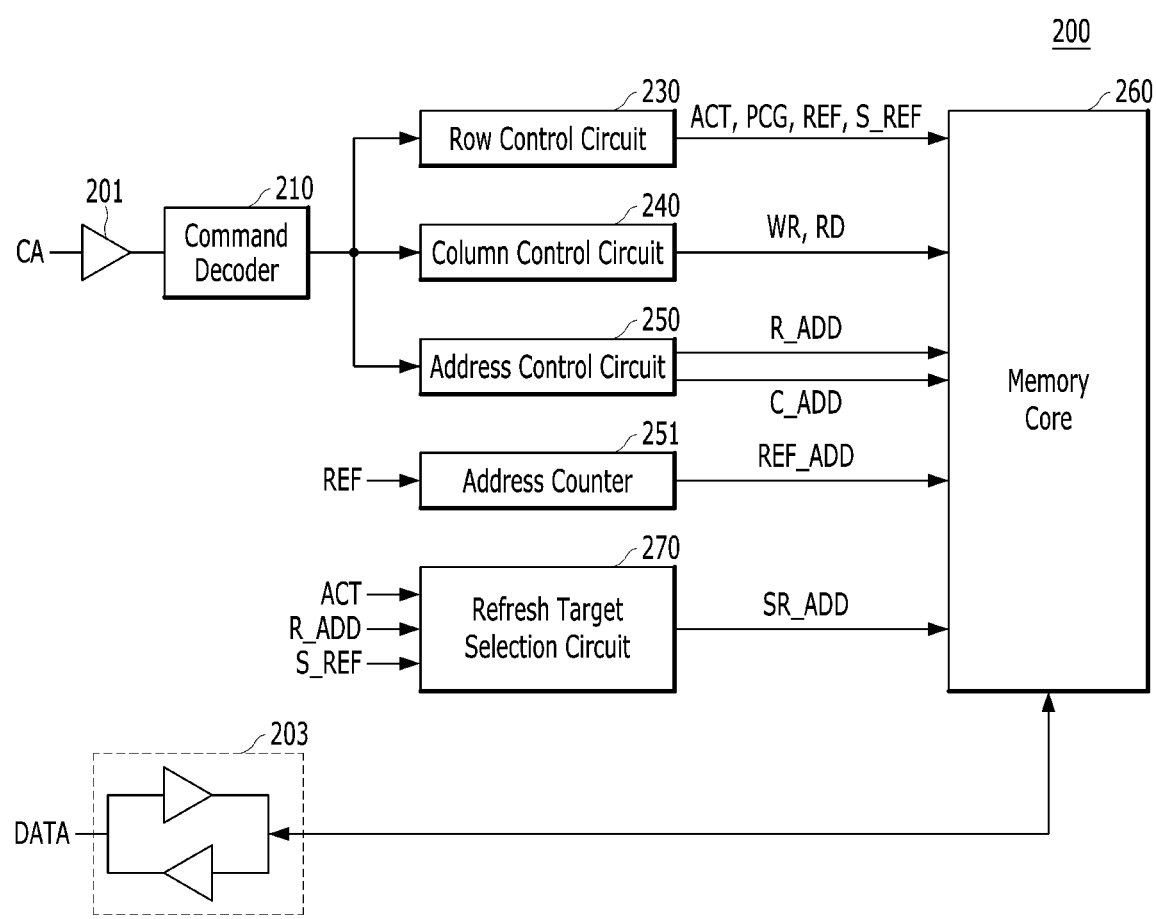
FIG. 2 is a block diagram illustrating a memory 200 in accordance with one embodiment of the present invention.

FIG. 2 is a block diagram illustrating a memory 200 in accordance with one embodiment of the present invention.

Referring to FIG. 2, the memory 200 may include a command address receiving circuit 201, a data transferring/receiving circuit 203, a command decoder 210, a row control circuit 230, a column control circuit 240, an address control circuit 250, an address counter 251, a memory core 260, and a refresh target selection circuit 270.

The command address receiving circuit 201 may receive a command and an address CA. According to the type of the memory 200, a command and an address may be input to the same input terminals, or a command and an address may be input to separate input terminals. Here in this example, it is illustrated that the command and the address are input to the same input terminals. The command and address CA may be of multiple bits.

The data transferring/receiving circuit 203 may receive data DATA or transfer data DATA. The data transferring/receiving circuit 203 may receive data DATA to be written to the memory core 260 during a write operation, and transfer data DATA read from the memory core 260 during a read operation.

The command decoder 210 may identify an operation, which the command and the address CA indicates, by decoding the command and the address CA.

When the command and the address CA indicates a row operation such as for example an active operation, a precharge operation, and a refresh operation, the row control circuit 230 may control the row operations. An active signal ACT may be a signal directing an active operation, and a precharge signal PCG may be a signal directing a precharge operation. The refresh signal REF may be a signal directing a refresh operation. A smart refresh signal S_REF may be a signal directing a smart refresh operation. Here in this example, the smart refresh operation may be an operation of refreshing a row selected by the refresh target selection circuit in a spare time during a refresh operation.

When the command and the address CA indicates a column operation, such as for example a write operation and a column operation, the column control circuit 240 may control the column operations. A write signal WR may be a signal directing a write operation, and a read signal RD may be a signal directing a read operation.

The address control circuit 250 may provide the memory core 260 with a row address R_ADD or a column address C_ADD, which are included in the command and the address CA. The address control circuit 250 may provide the memory core 260 with the address included in the command and the address CA as a row address R_ADD when an active operation is indicated by the command and the address CA, and as a column address C_ADD when a read operation or a write operation is indicated by the command and the address CA.

The address counter 251 may generate a refresh address REF_ADD to be used during a refresh operation. The address counter 251 may change the refresh address REF_ADD by '+1' whenever a refresh signal REF is activated. Since the refresh address REF_ADD is changed whenever the refresh signal REF is activated, the rows of the memory core 260 may be sequentially refreshed.

The refresh target selection circuit 270 may select a row on which a smart refresh operation is to be performed. The refresh target selection circuit 270 may select a row with a high possibility of data loss due to row hammering among the rows of the memory core 260 and provide information of the selected row, i.e., a smart refresh address SR_ADD, to the memory core 260. The refresh target selection circuit 270 may use an active signal ACT and a row address R_ADD to monitor the history of activation of the rows of the memory core 260. The smart refresh address SR_ADD output from the refresh target selection circuit 270 may be an address designating a row on which a smart refresh operation is to be performed. The structure and operation of the refresh target selection circuit 270 will be described later with reference to FIGS. 3 and 4.

The memory core 260 may perform an operation directed by the internal command signals ACT, PCG, WR, RD, REF, and S_REF. The memory core 260 may include constituent elements capable of performing the above-noted operations as an active operation, a precharge operation, a read operation, a write operation, a read operation, a refresh operation, and a smart refresh operation, that is, the memory core 260 may include a cell array including memory cells that are arranged in a plurality of rows and a plurality of columns, a row decoder for activating/deactivating a row of the cell array, a column decoder for inputting/outputting data to/from the cell array, and an input/output circuit. When the active signal ACT is activated, a row selected based on the row address R_ADD among the rows of the memory core 260 may be activated. When a precharge signal PCG is activated, the activated row may be deactivated. When a write signal WR is activated, data may be written to the columns selected based on the column address C_ADD among the columns of the memory core 260, and when the read signal RD is activated, data may be read from the columns selected based on the column address C_ADD among the columns of the memory column 260. When a refresh signal REF is activated, a row selected based on the refresh address REF_ADD among the rows of the memory core 260 may be refreshed. Also, when a smart refresh signal S_REF is activated, a row selected based on the smart refresh address SR_ADD among the rows of the memory core 260 may be refreshed.

Figure 3:
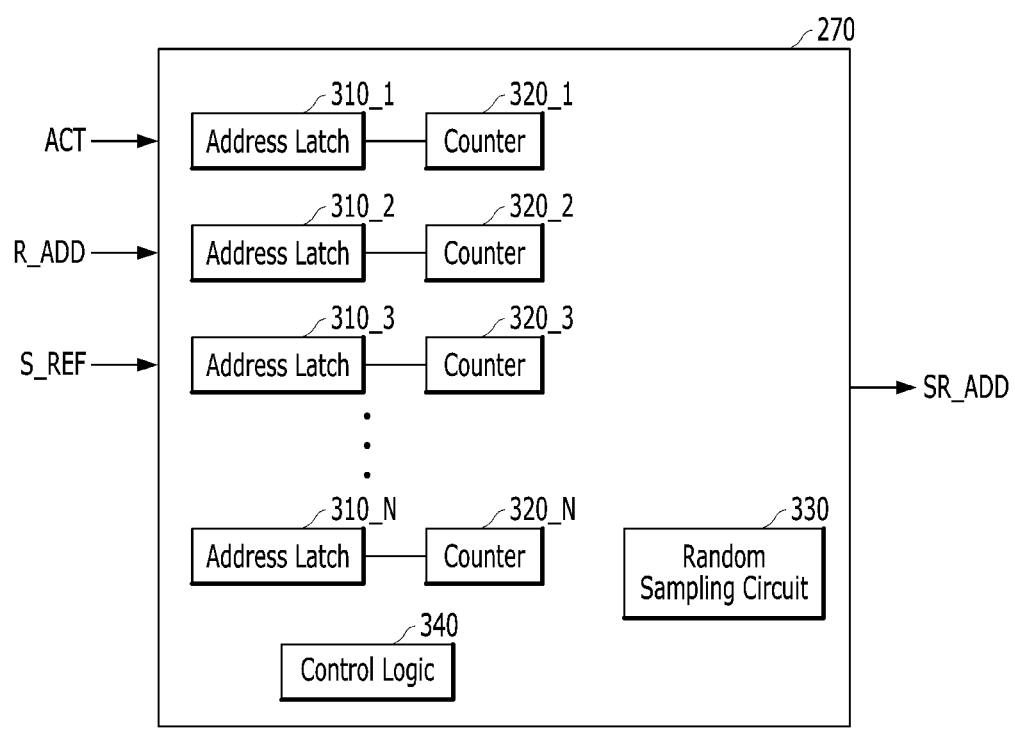
FIG. 3 is a block diagram illustrating a refresh target selection circuit 270 shown in FIG. 2.

FIG. 3 is a block diagram illustrating a refresh target selection circuit 270 shown in FIG. 2.

Referring to FIG. 3, the refresh target selection circuit 270 may include N address latches 310_1 to 310_N, N counters 320_0 to 320_N, a random sampling circuit 330, and a control logic 340.

The N address latches 310_1 to 310_N may store the respective addresses of activated rows on which an active operation has been performed in the memory core 260. Here, N may be an integer of 2 or more. Since there is inevitably a limit on the number of the address latches 310_1 to 310_N, all activated rows may not be stored in the address latches 310_1 to 310_N. For example, when the number of the address latches is 16, only the addresses of 16 activated rows may be stored in the address latches 310_1 to 310_16, and when the address latches 310_1 to 310_16 are filled with 16 addresses, the address of the activated row may not be stored.

The N counters 320_0 to 320_N may respectively correspond to the N address latches 310_1 to 310_N and may count respective risk scores of the activated rows, the addresses of which are stored in the respective N address latches 310_1 to 310_N. For example, the counter 320_1 may count the risk score of a row corresponding to the address stored in the address latch 310_1. Here in this example, the risk score may be a score indicating the risk that the data of the neighboring rows of the corresponding row are lost. For example, when the address of a fifth row is stored in the address latch 310_3 and the risk score currently stored in the counter 320_3 is high, it may mean that the data of the rows disposed adjacent to the fifth row, which are the fourth and sixth rows, are highly likely to get lost.

The risk score of the counters 320_0 to 320_N may increase whenever the following conditions (1) and (2) are satisfied.

(1) The risk score increases when the corresponding row is activated (i.e., in an active state).

For example, when a $53^{rd}$ row is stored in the address latch 310_2 and an active operation is performed on the $53^{rd}$ row, the counter 320_2 may increase the risk score by 1. This is because the risk of data loss of the rows disposed adjacent to the active row increases whenever a specific row is activated.

(2) When a row corresponding to the '+2' position of the corresponding row or a row corresponding to the '−2' position of the corresponding row is activated (i.e., in an active state), the risk score may increase.

For example, when the $53^{rd}$ row is stored in the address latch 310_2 and an active operation is performed on a $51^{st}$ row, the counter 320_2 may increase the risk score by 1. Similarly, when an active operation for a $55^{th}$ row is performed, the counter 320_2 may increase the risk score by 1. Increasing the risk score whenever the row at the '+2' position of the corresponding row or the row at the '−2' position of the corresponding row is activated may cope with the double side attack. The double side attack refers to alternate activation of rows on both sides of a specific row. Due to the double side attack, the specific row may become to have a high risk of losing data stored therein. For example, alternate activation of the $53^{rd}$ row and the $55^{th}$ row may result in the double side attack on a $54^{th}$ row. When the condition of (2) implies a double side attack on neighboring rows of the corresponding row (i.e., rows corresponding to '+1' and '−1' positions of the corresponding row), thus increasing the risk score of the corresponding row.

Here, when the condition of (1) is satisfied or the condition of (2) is satisfied, the risk score may increase by 1, but the extent that the risk score increases may be set differently from the case of (1) and the case of (2). For example, when the condition of (1) is satisfied, the risk score may increase by 1, but when the condition of (2) is satisfied, the risk score may increase by 2.

The random sampling circuit 330 may randomly sample and store one row among the rows that are activated in the memory core 260, that is, among the rows on which an active operation is performed. In other words, the random sampling circuit 330 may store an address corresponding to one row that is randomly selected from a number of rows activated in the memory core 260.

The control logic 340 may control the address latches 310_1 to 310_N, the counters 320_0 to 320_N, and the random sampling circuit 330. When a smart refresh operation is performed, that is, when a smart refresh signal S_REF is activated, the control logic 340 may provide the memory core 260 with the smart refresh address SR_ADD, which is the address of the neighboring row of the row corresponding to the address stored in the address latch with the highest risk score among the address latches 310_1 to 310_N. For example, when the $53^{rd}$ row corresponds to the address latch 310_2 and the risk score stored in the counter 320_2 is the highest, the control logic 340 may provide the memory core 260 with the smart refresh address SR_ADD indicating the address of the $52^{nd}$ row and the address of the $54^{th}$ row, which are disposed adjacent to the $53^{rd}$ row, so that the $52^{nd}$ row and the $54^{th}$ row are refreshed in the memory core 260 during a smart refresh operation.

After the smart refresh operation, the address latch having the highest risk score among the address latches 310_1 to 310_N and a counter corresponding thereto may be initialized. For example, when the $53^{rd}$ row corresponding to the address latch 310_2 has the highest risk score and thus the $52^{nd}$ row and the $54^{th}$ row are refreshed by a smart refresh operation, the address latch 310_2 and the counter 320_2 may be initialized. In the initialized address latch (e.g., 310_2), the address sampled in the random sampling circuit 330 may be newly stored, and the random sampling circuit 330 may be initialized. After initialization, the random sampling circuit 330 may store the address corresponding to one row which is randomly selected from the rows that are activated in the memory core 260 again.

When the address sampled by the random sampling circuit 330 is the same as an address already stored in the initialized address latch (e.g., 310_2) among the address latches 310_1 to 310_N, the random sampling circuit 330 may be initialized but the sampled address may not be stored in the initialized address latch (e.g., 310_2). Instead of the sampled address, the address of the next activated row may be stored in the initialized address latch (e.g., 310_2).

Figure 4:
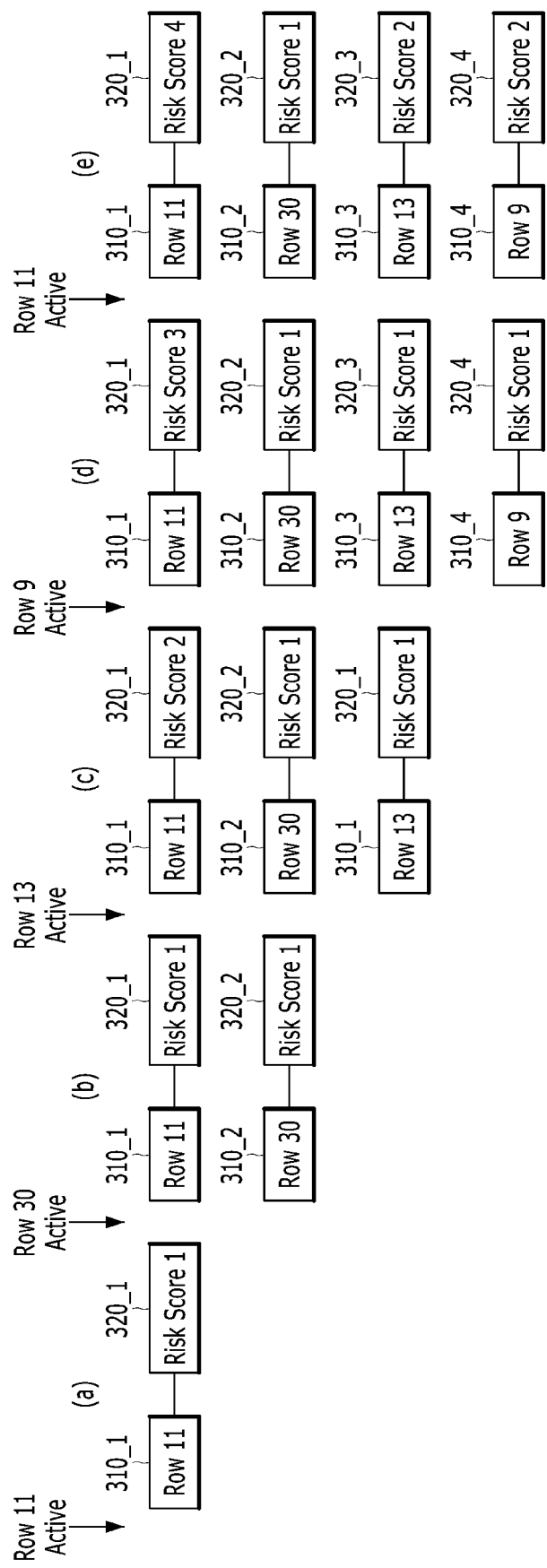
FIG. 4 illustrates an operation of the refresh target selection circuit 270 shown in FIG. 3.

FIG. 4 illustrates an operation of the refresh target selection circuit 270 shown in FIG. 3.

Referring to FIG. 4, a $11^{th}$ row may be activated in the memory core 260. Accordingly, the address of the $11^{th}$ row may be stored in the address latch 310_1, and the risk score of the counter 320_1 may be updated to 1. This is shown in (a).

Subsequently, a $30^{th}$ row may be activated in the memory core 260. Accordingly, the address of the $30^{th}$ row may be stored in the address latch 310_2 and the risk score of the counter 320_2 may be updated to 1. This is shown in (b).

Subsequently, the $13^{th}$ row may be activated in the memory core 260. Accordingly, the address of the $13^{th}$ row may be stored in the address latch 310_3, and the risk score of the counter 320_3 may be updated to 1. Since the address of the $13^{th}$ row is '11+2', the risk score of the counter 320_1 may increase by 1 to become 2. This is shown in (c).

Subsequently, a $9^{th}$ row may be activated in the memory core 260. Accordingly, the address of the $9^{th}$ row may be stored in the address latch 310_4, and the risk score of the counter 320_4 may be updated to 1. Since the address of the $9^{th}$ row is '11−2', the risk score of the counter 320_1 may increase by 1 to become 3. This is shown in (d).

Subsequently, the $11^{th}$ row may be activated in the memory core 260. Accordingly, the risk score of the counter 320_1 may increase by 1 to become 4. Meanwhile, since the address of the 11th row is '13-2', the risk score of the counter 310_3 may increase by 1 to become 2. Also, since the address of the $11^{th}$ row is '9+2', the risk score of the counter 310_4 may increase by 1 to become 2. This is shown in (e).

The address latches 310_1 to 310_N and the counters 320_0 to 320N of the refresh target selection circuit 270 may be updated as illustrated in FIG. 4. Also, during a smart refresh operation, the neighboring rows of the row corresponding to the address stored in the address latch having the highest risk score among the address latches 310_1 to 310_N may be refreshed.

According to one embodiment of the present invention, rows to be refreshed may be efficiently selected according to those rows that have experienced more row hammering.

While the present invention has been described with respect to the specific embodiments, it will be apparent to those skilled in the art that various changes and modifications may be made without departing from the spirit and scope of the invention as defined in the following claims.

What is claimed is:

1. A memory, comprising:
   a memory core including memory cells that are arranged in a plurality of rows and a plurality of columns;
   N address latches respectively suitable for storing addresses of N activated rows, N being an integer equal to or greater than 2;
   N counters respectively corresponding to the N address latches and respectively counting the risk scores of the N activated rows; and
   a random sampling circuit suitable for randomly sampling an address of an activated row in the memory core.

2. The memory of claim 1, wherein the memory core is suitable for refreshing, during a smart refresh operation of the memory, rows disposed adjacent to a row corresponding to an address with a highest risk score among the addresses stored in the N address latches.

3. The memory of claim 2, wherein the random sampling circuit is further suitable for replacing, with the randomly sampled address, a value stored in an address latch selected during the smart refresh operation among the N address latches.

4. The memory of claim 2, wherein each of the N address latches is further suitable for initializing the address stored therein after the memory core performs the smart refresh operation of a row corresponding to the address stored in the address latch when the address stored in the address latch is the same as the randomly sampled address.

5. An operating method of a memory, the operating method comprising:
   randomly sampling an address of an activated row in a memory core;
   receiving a smart refresh command;
   performing a smart refresh operation for rows disposed adjacent to a row corresponding to an address with the highest risk score among addresses stored in address latches, in response to the smart refresh command; and
   replacing the address with the highest risk score in the address latches with the randomly sampled address.

6. The operating method of claim 5, wherein the replacing includes:
   initializing an address latch storing the address with the highest risk score among the address latches; and
   storing the randomly sampled address in the initialized address latch.

* * * * *